US012660255B2

(12) United States Patent
Hughes

(10) Patent No.: US 12,660,255 B2
(45) Date of Patent: Jun. 16, 2026

(54) PULSED-LASER MODIFICATION OF QUANTUM-PARTICLE CELLS

(71) Applicant: ColdQuanta, Inc., Boulder, CO (US)

(72) Inventor: Steven Michael Hughes, Louisville, CO (US)

(73) Assignee: ColdQuanta, Inc., Boulder, CO (US)

( * ) Notice: Subject to any disclaimer, the term of this patent is extended or adjusted under 35 U.S.C. 154(b) by 616 days.

(21) Appl. No.: 17/493,155

(22) Filed: Oct. 4, 2021

(65) Prior Publication Data

US 2022/0262929 A1     Aug. 18, 2022

Related U.S. Application Data

(60) Provisional application No. 63/150,440, filed on Feb. 17, 2021.

(51) Int. Cl.
*B82Y 10/00* (2011.01)
*B82Y 20/00* (2011.01)
(Continued)

(52) U.S. Cl.
CPC ....... *H10D 48/383* (2025.01); *H10P 14/3816* (2026.01)

(58) Field of Classification Search
CPC ........ H01L 29/66977; H01L 21/02686; H10D 48/383; G21K 1/00; B82Y 10/00; B82Y 20/00; H10P 14/3816
See application file for complete search history.

(56) References Cited

U.S. PATENT DOCUMENTS 7,645,681 B2 * 1/2010 Okada ..................... C03C 27/06
438/455
9,117,563 B2   8/2015 Hughes
(Continued)

FOREIGN PATENT DOCUMENTS

CN      101407372 B      1/2011
CN      103342335 A     10/2013
(Continued)

OTHER PUBLICATIONS

Miyamoto et al, Novel fusion welding technology of glass using ultrashort pulse lasers, 2010, Physics Procedia, p. 483-493. (Year: 2010).*

(Continued)

*Primary Examiner* — Chad M Dicke
*Assistant Examiner* — Valerie N Newton
(74) *Attorney, Agent, or Firm* — Young Basile Hanlon & MacFarlane, P.C.

(57) ABSTRACT

A pulsed-laser applies short (e.g., less than 10 pico-seconds) pulses to modify quantum particle (e.g., alkali-metal and alkaline-earth-metal atoms) ultra-high vacuum (UHV) cells to bond, ablate, and/or chemically modify vacuum-facing surfaces of the cell. The pulses are generated outside the cell and are transmitted through a vacuum-boundary wall. In one example, one vacuum-boundary wall is first contact bonded to other vacuum boundary walls at a relatively low temperature (below 200° C.), sufficient to form a temporary hermetic seal. Pulsed laser bonding is used to reinforce the contact bonds, correcting defects and generally increasing the robustness of the seal. The pulses provide high peak power to ensure strong bonds, but low total heat so as to avoid heat damage to nearby cell components and to limit quantum-particle sorbtion to and into cell walls.

20 Claims, 14 Drawing Sheets

(51) Int. Cl.
  G21K 1/00 (2026.01)
  H10D 48/00 (2025.01)
  H10P 14/20 (2026.01)

(56) References Cited

U.S. PATENT DOCUMENTS

| | | | |
|---|---|---|---|
| 9,701,581 B2 | 7/2017 | Kangastupa | |
| 9,763,314 B1* | 9/2017 | Roper | H05H 3/02 |
| 9,837,177 B1 | 12/2017 | Roper | |
| 9,960,025 B1 | 5/2018 | Hughes | |
| 10,460,918 B2 | 10/2019 | Hughes | |
| 10,629,417 B1 | 4/2020 | Hughes | |
| 10,755,831 B2 | 8/2020 | Anderson | |
| 10,859,981 B1* | 12/2020 | Ramirez-Serrano | C03C 27/06 |
| 11,150,609 B1 | 10/2021 | Parazzoli | |
| 11,257,605 B2 | 2/2022 | Anderson | |
| 11,320,588 B1 | 5/2022 | Mazed | |
| 11,397,085 B1 | 7/2022 | Anderson | |
| 11,415,614 B2 | 8/2022 | Salim | |
| 11,592,469 B2 | 2/2023 | Anderson | |
| 11,733,655 B2 | 8/2023 | Salim | |
| 11,776,797 B2 | 10/2023 | Hughes | |
| 2006/0267023 A1* | 11/2006 | McBride | B81C 3/001 |
| | | | 257/77 |
| 2007/0001579 A1 | 1/2007 | Jeon | |
| 2010/0033256 A1* | 2/2010 | Strabley | G04F 5/14 |
| | | | 331/3 |
| 2010/0213367 A1 | 8/2010 | Miller | |
| 2011/0186728 A1 | 8/2011 | Franzen | |
| 2013/0280440 A1 | 10/2013 | Zhang | |
| 2013/0344302 A1 | 12/2013 | Hélie | |
| 2014/0218802 A1 | 8/2014 | Saito | |
| 2015/0244382 A1 | 8/2015 | Ishihara | |
| 2015/0259816 A1 | 9/2015 | Minsek | |
| 2016/0023401 A1 | 1/2016 | Fujii et al. | |
| 2016/0126965 A1 | 5/2016 | Hashi | |
| 2016/0308543 A1 | 10/2016 | Ishihara | |
| 2017/0133210 A1 | 5/2017 | Tanaka | |
| 2017/0331485 A1* | 11/2017 | Gobet | G04F 5/14 |
| 2018/0212612 A1 | 7/2018 | Park | |
| 2018/0233337 A1 | 8/2018 | Hughes | |
| 2018/0233338 A1 | 8/2018 | Hughes | |
| 2018/0351116 A1 | 12/2018 | Wada | |
| 2019/0027355 A1 | 1/2019 | Kim | |
| 2019/0041550 A1 | 2/2019 | Ganjoo et al. | |
| 2019/0109597 A1 | 4/2019 | Matsuda | |
| 2019/0293923 A1 | 9/2019 | Ghahremani | |
| 2019/0322577 A1 | 10/2019 | Dussauze | |
| 2021/0335591 A1 | 10/2021 | Kim | |
| 2021/0410266 A1 | 12/2021 | Saffman | |
| 2022/0084709 A1 | 3/2022 | Hughes | |
| 2022/0196716 A1 | 6/2022 | Anderson | |
| 2022/0262609 A1 | 8/2022 | Hughes | |
| 2022/0291268 A1 | 9/2022 | Anderson | |
| 2023/0169385 A1 | 6/2023 | Meinert et al. | |
| 2023/0246117 A1 | 8/2023 | Hughes | |

FOREIGN PATENT DOCUMENTS

| | | |
|---|---|---|
| EP | 2505297 | 8/2016 |
| RU | 2683455 C1 | 3/2019 |
| TW | 545662 | 8/2016 |
| WO | 2019122924 A1 | 6/2019 |

OTHER PUBLICATIONS

Lee et al., Sealing Success: Developing a Photonics Packaging Company, Aug. 26, 2020.

Vrijsen et al., Efficient Isotope-Selective Pulsed Laser Ablation Loading of 174Yb+ Ions in a Surface Electrode Trap, Research Article, Optics Express, vol. 27, No. 23, Nov. 11, 2019, Optics Express 33907.

Watanabe et al., Direct Joining of Glass Substrates by 1kHz Femtosecond Laser Pulses, Applied Physics B, Laser and Optics, Appl. Phys. B 87, pp. 85-89, 2007.

Hofmann et al., An Experimental Approach for Investigating Many-Body Phenomena in Rydberg-Interacting Quantum Systems, Jul. 3, 2013.

Chuang et al., The fabrication of through-wafer interconnects in silicon substrates for ultra-high-vacuum atom-optics cells, Journal of Micromechanics and Microengineering, published Feb. 22, 2008.

Grzebyk et al., Lateral MEMS-type field emission electron source, IEEE Transactions on Electron Devices, vol. 63, No. 2, Feb. 1, 2016, pp. 809-813.

Salim et al., Compact, microchip-based systems for practical applications of ultracold atoms, Quantum Inf Process 10, 2011, pp. 975-994.

Losev et al., "Production of miniature Glass Cells with Rubidium for Chip Scale Atomic Clock", Physics Procedia, vol. 71, pp. 242-246, 2015, DOI: 10.1016/J.PHPRO.2015.08.357.

Tao et al., "Selective Bonding and Encapsulation for Wafer-Level Vacuum Packaging of MEMS and Related Micro Systems", Micro-electronics Reliability: An Internat Journal & Word Abstracting Service, Elsevier Science Ltd, vol. 44, No. 2, pp. 251-258, Feb. 1, 2004, DOI: 10.1016/S0026-2714(03)00192-6.

Extended European Search Report issued in corresponding European Application No. 22756760.9, dated Dec. 6, 2024.

* cited by examiner

Quantum-Particle Cell Manufacturing Process <u>100</u>

Cover 104

Sidewalls 106

← Body 104 →

Base 106

Loading & Contact Bonding 110

Cover 104

$^{87}$Rb
<u>112</u>

Pulsed Laser Bonding 120

$^{87}$Rb
<u>112</u>

Laser Bonds 122

← Completed Cell 124 →

Quantum-Particle Cell Manufacturing System 200

Microchannel UHV Cell 600

Quantum-particle Cell 700

Quantum-Particle Cell Manufacturing System 900

PULSED-LASER MODIFICATION OF QUANTUM-PARTICLE CELLS

BACKGROUND

Quantum-particle cells are designed to hold quantum-state carriers (e.g., alkali-metal and alkaline-earth-metal atoms) under ultra-high vacuum (UHV) conditions while their quantum states are controlled and monitored using electro-magnetic radiation (EMR) that accesses them through windows and/or walls of the cell. In addition to containing the quantum particles, a quantum-particle cell can include components for guiding the particles and/or the EMR and for establishing, maintaining, and restoring UHV conditions.

More compact quantum-particle cells allow the quantum systems incorporating the cells to be more compact and more economical. In addition, cost savings can be achieved as smaller quantities of expensive quantum particle source material can be required when more compact cells are used. However, the manufacturing of more compact cells faces new challenges. For example, temperatures generated during manufacturing can adversely affect various cell components and drive quantum particles into cell walls. The heat can be manageable in a large cell as the affected entities can be protected by the thermal gradients over larger distances. In a more compact cell, there is less room available for heat to attenuate before it reaches heat-sensitive components. Also, some manufacturing processes releases oxygen that can passivate particle sources and getters, undermining their functionalities. Accordingly, quantum-particle cell manufacturing is in need of some innovation to address the challenges posed by more compact quantum-particle cells.

DETAILED DESCRIPTION

The present invention provides for pulsed-laser modification of quantum particle cells. The lasers of interest herein can deliver high peak intensity over a small area and over a short duration (e.g., from below one nanosecond (ns) to below one femtosecond (fs) so that the total heat delivered per pulse is quite small. As a result, thermal gradients fall off steeply so as to avoid damage to nearby heat-sensitive components. Another advantage of the lasers is that they can be focused through the typically transparent walls of a quantum-particle cell enabling modification of internal surfaces of a sealed cell, thus enabling late-stage manufacturing and post-manufacturing repair of compact quantum-particle cells, including cells with sub-milliliter vacuum volumes.

Figure 1:
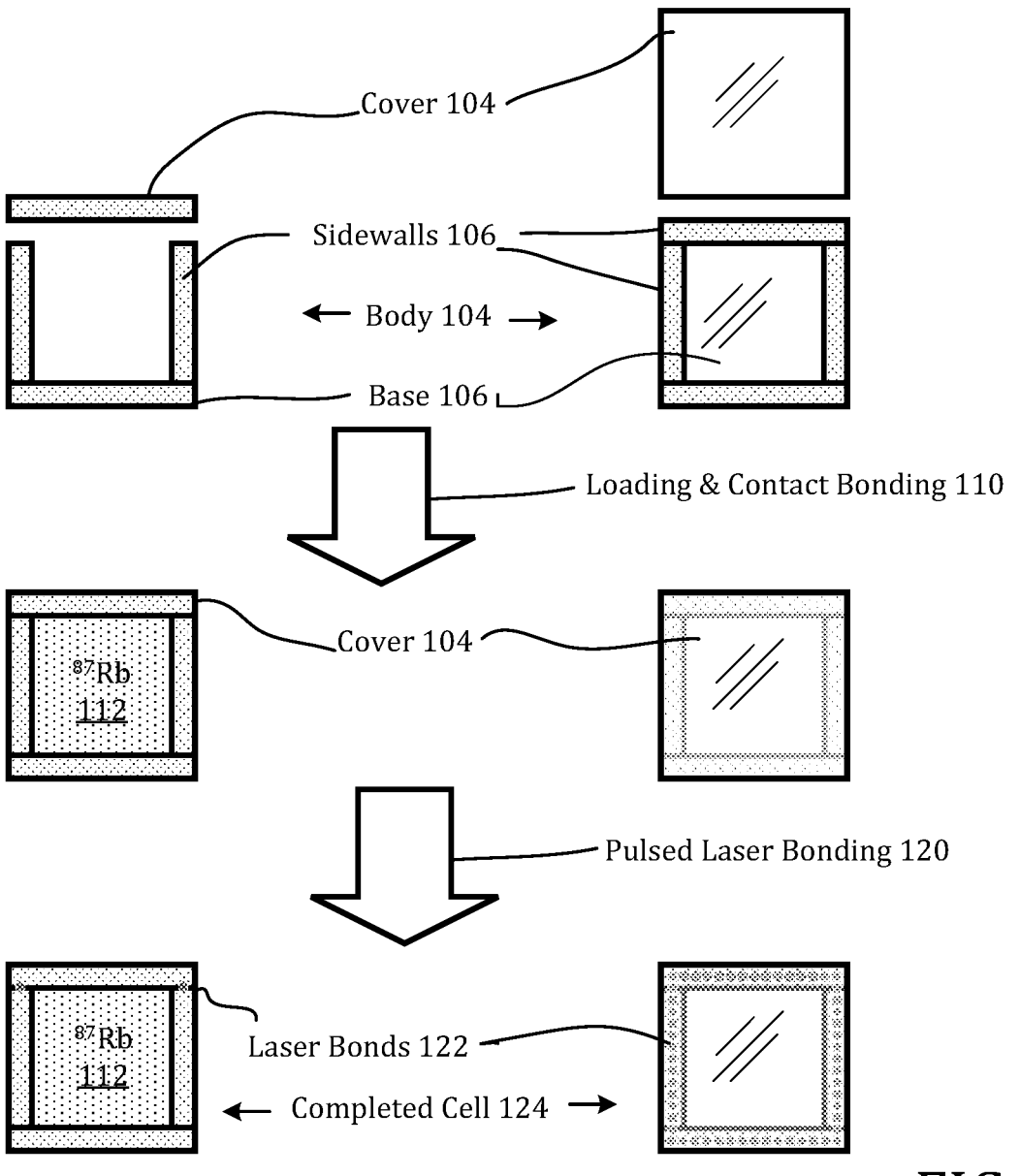
FIG. 1 is a flow diagram of a quantum-particle cell manufacturing process.

A quantum-particle cell manufacturing process 100 is represented in FIG. 1. The desired end product of process 100 is a securely sealed vapor cell filled with quantum particles such as rubidium 87 ($^{87}$Rb) atoms as shown at the bottom left of FIG. 1. Alternatively, the cell could include quantum particles in liquid or solid form; also, the quantum particles can be an isotope of $^{87}$Rb, other atomic species, and/or other molecular entities (e.g., ions, polyatomic molecules). The top left and right of FIG. 1 show a quantum-particle cell body 102 with its top cover 104 yet to be attached. Particle cell body 102 includes a bottom cover, i.e., base 106, and four sidewalls 108.

At 110, quantum particles or a source of quantum particles is loaded into the body and then the cover is contact bonded to the body so as to seal the quantum particle cell. The quantum particles can be loaded in vapor form, in liquid form, or in solid form. In some cases, a quantum particle, or a reversable compound thereof, can be stored in a glass ampule or carbon host for later release. Unassisted contact bonding can take weeks or months to achieve desired bond strengths. Quicker bonding can be achieved using methods such as electrically assisted contact bonding or chemically assisted contact bonding (e.g., hydroxide bonding). Where the surfaces to be bonded are glass and silicon, anodic bonding can be used. Pulsed laser bonding 120 can be applied to assist or reinforce any such bond. Laser pulses can be applied along a closed path to form a complete seal. Adjacent laser bonds can overlap so that there are no gaps in the laser-bonded seal. In an alternative embodiment, the contact bonding is omitted, and laser bonding is relied upon exclusively for a hermetic seal.

Figure 2:
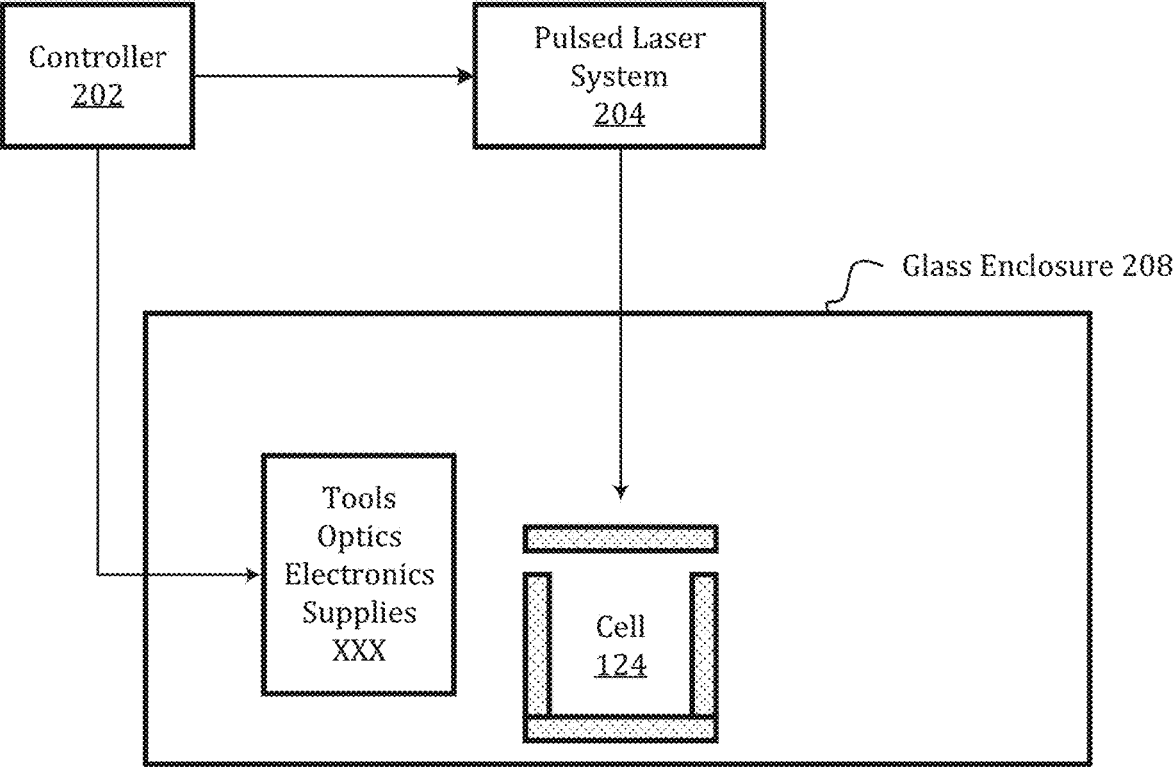
FIG. 2 is a schematic diagram of a manufacturing system for the quantum-particle cell being manufactured in FIG. 1.

A quantum-particle cell manufacturing system 200 is shown in FIG. 2 including a controller 202, a laser system 204, and an ultra-high vacuum (UHV) station 206. UHV station 206 includes a rectangular parallelepiped glass enclosure 208 as well as tools, optics, electronics, and supplies 210. As shown in FIG. 2, system 206 includes quantum-particle cell 124 in the course of its manufacture. Laser system 204 accesses cell 124 through glass enclosure 208. One advantage of manufacturing in a UHV environment is that the desired UHV is automatically achieved in the manufactured cell. Another advantage is the paucity of contaminants that otherwise could degrade cell 124 as it is being manufactured.

In an embodiment, cell manufacture is completed within enclosure 208. However, in the illustrated embodiment, the contact bonded cell is removed from the UHV environment before laser bonding/reinforcement/annealing. The cover is pulled against the cell body by the external pressure as the laser bonding completes cell manufacture. An advantage of performing the laser bonding outside enclosure 208 is that there is one less (potentially inward curved) glass layer to penetrate, thus reducing power loss, beam quality, and accuracy.

Figure 3:
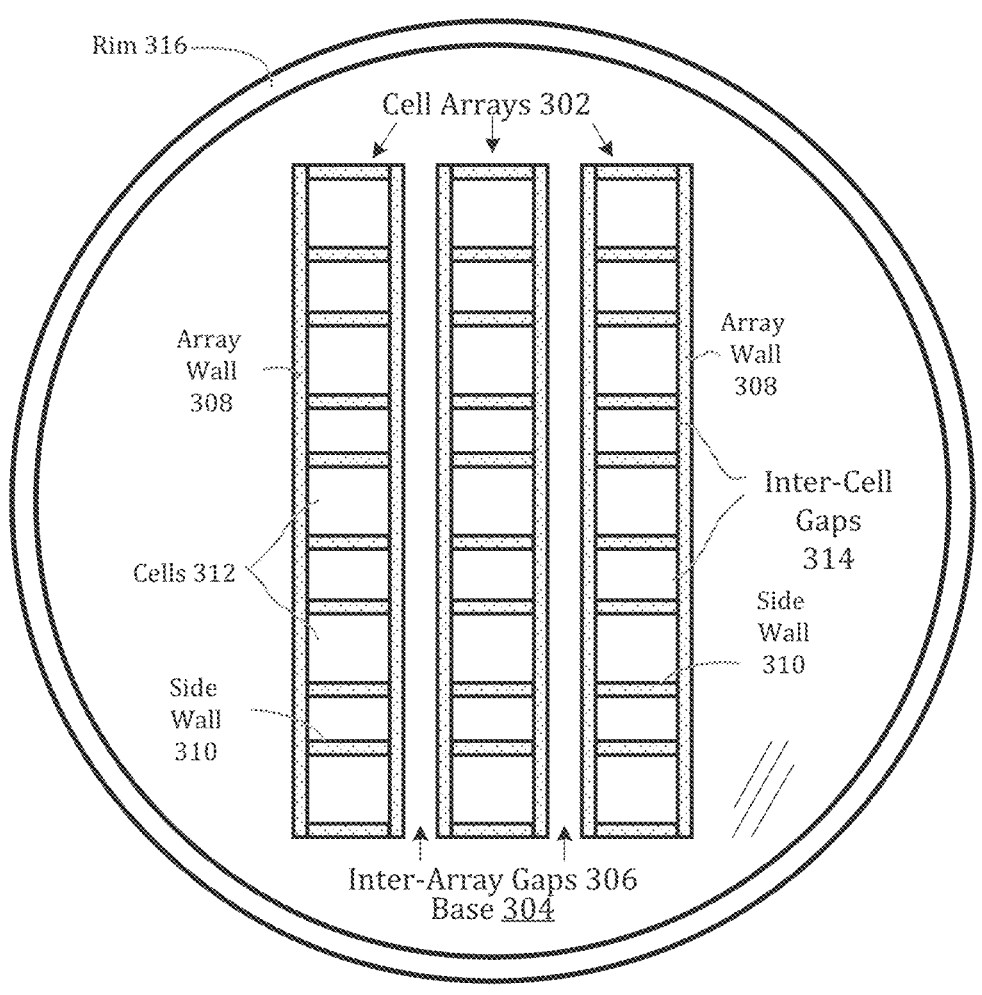
FIG. 3 represents a step in the manufacturing of plural quantum-particle cells.

Economies of scale can be achieved by manufacturing multiple cells at once. As shown in FIG. 3, cell arrays 302 are arranged on and contact bonded to a base 304 so as to define inter-array gaps 306. Since they are formed before components and/or quantum particles are introduced, the anodic bonds can be formed at a high temperature, e.g., 300° C. to achieve strong bonds in a relatively short time, or by other convenient/appropriate means. Each array 302 includes a pair of array walls 308 and sidewalls 310 extending between array walls and defining cells 312 and inter-cell gaps 314. In some embodiments a peripheral rim 316 is bonded to base 304. The resulting structure can be inserted into a UHV environment such as that shown in FIG. 2. Depending on the embodiment, components and/or quantum particles can be inserted into the cells before or after the assembly is inserted into the UHV environment.

Figure 4:
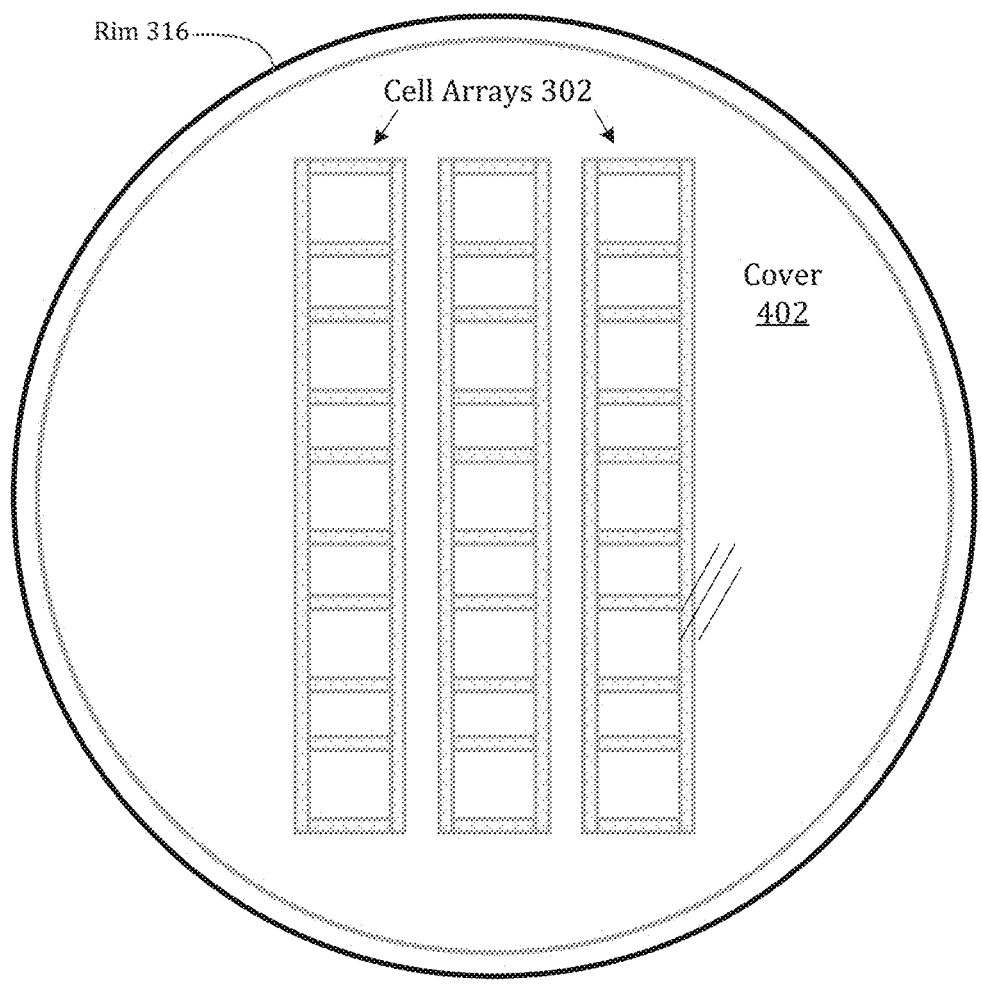
FIG. 4 shows the quantum-particle cells of FIG. 3 after bonds holding a top cover in place over the quantum-particle cells of FIG. 3 have been reinforced with pulsed laser bonds.

While the assembly is in the UHV environment, a glass cover 402 can be contact bonded to rim 316 and or to arrays 302 as represented in FIG. 4. The bonding can be unassisted contact bonding, thermally assisted contact bonding, and/or electrically assisted contact bonding. However, any heating may need to be limited to avoid problems with cell components or the quantum particles or source of quantum particles. The result can be a seal that is hermetic, but might not be sufficiently robust to withstand subsequent dicing to separate the cells.

The cover band can suffice to allow the covered assembly to be moved to a laser station for laser stitching. In some embodiments, the laser stitching can take place while the assembly is in the UHV environment. In some such embodiments, the contact bonding of the cover can be omitted. However, it can be easier to focus laser beams at the exact depth where the bottom surface of the cover meets the top surfaces of the cells and/or the rim without a wall of the UHV environment in the laser beam path.

Figure 5:
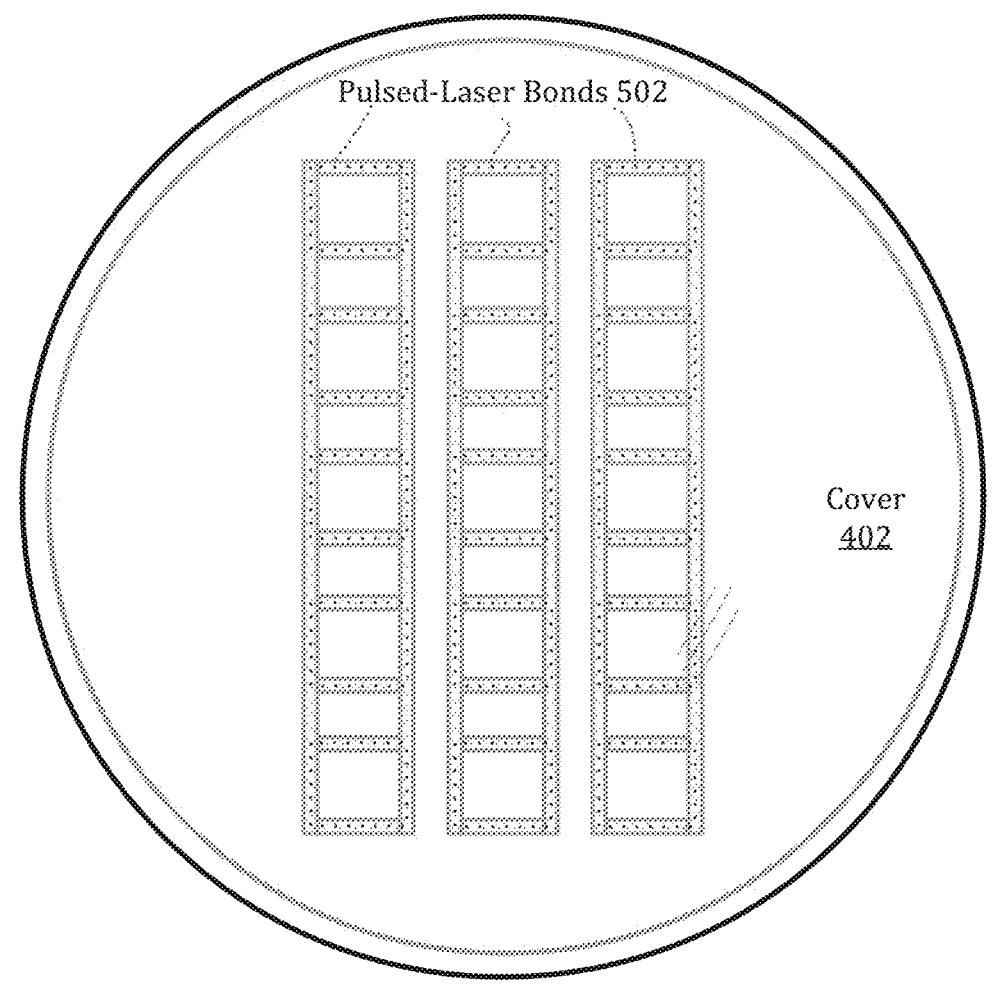
FIG. 5 shows the quantum particle cells and cover of FIG. 4 after the cover has been bonded to the individual quantum-particle cells using the pulsed laser.

At the laser station, the cover can be laser stitched to seal the cells hermetically and robustly; the resulting pulsed-laser bonds 502 are shown in FIG. 5. The individual bonds can overlap to ensure a continuous seal or be spaced to reduce potential stress/strain fractures allowing gaps to be contact bonds effectively staked in place by adjacent laser bonds. The overlapping bonds need not be made sequentially. Instead, the order in which the individual bonds (one bond per pulse) can be out of sequence to allow each pulse bond to cool before its neighbors are formed. In FIG. 5, the cells are hermetically sealed, but the gaps are bonded only at the sidewalls and not along the array wall. In an alternative embodiment, pulse bonds are also formed all along the array walls.

Figure 6:
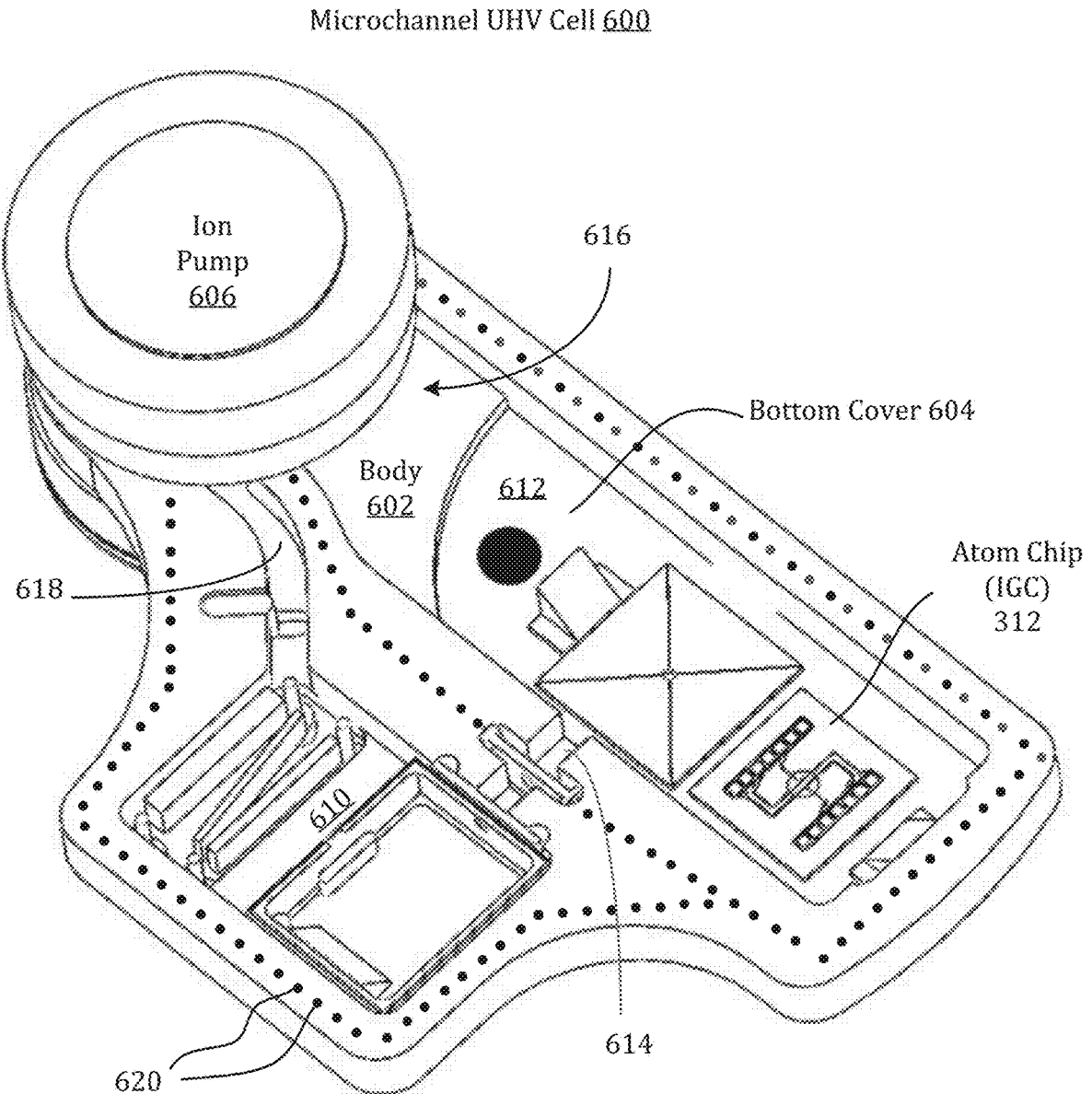
FIG. 6 shows a multi-chamber quantum-particle cell with the locations of pulsed laser bonds indicated.

As shown in FIG. 6, a microchannel UHV cell 600 includes a body 602, a bottom cover 604, a top cover (not shown), and an ion pump 608. Body 602 was formed from a monolithic slab of material such as silicon or glass by removing material to define chambers and inter-chamber channels. The chambers include a source chamber 610, a magneto-optical trap (MOT) chamber 612, and an ion pump chamber (occluded by ion pump 606). Inter-chamber channels include a source-to-MOT channel 614, a MOT-to-pump channel 616, and a source-to-pump channel 618 (which is gated as it is open only during maintenance procedures).

The cover can be bonded to raised areas of body 602, e.g., using contact bonding or hydroxide bonding. In the variation in which the body is silicon and the top cover is glass, anodic bonding can be used. The strongest bonds can be made using thermally assisted contact bonding or anodic bonding at high temperatures, e.g., around 300° C. However, such high temperatures could impair internal components such as sources and getters in the source chamber and an atom chip in the MOT chamber. Also, anodic bonding releases oxygen, the amount of oxygen released correlating with temperature. The oxygen can passivate alkali-metal sources and getter materials and, so, reduce their usefulness.

To avoid such impairment, bonding temperatures can be limited to a laser maximum temperature, e.g., 150° C. An additional advantage of the lower temperatures is that it relaxes the coefficient of thermal expansion (CTE) constraints on the cover so that, for example, a cover material with lower helium permeability can be used. On the other hand, the lower-temperature bonds can be weaker and more subject to unintentional debonding. The relatively weak anodic bonds can be reinforced or completed with laser pulse bonds 620. Alternatively, the laser pulse bonds can be overlapped or at least spaced more closely as needed to form a hermetic bond in lieu of contact or anodic bonding.

Figure 7:
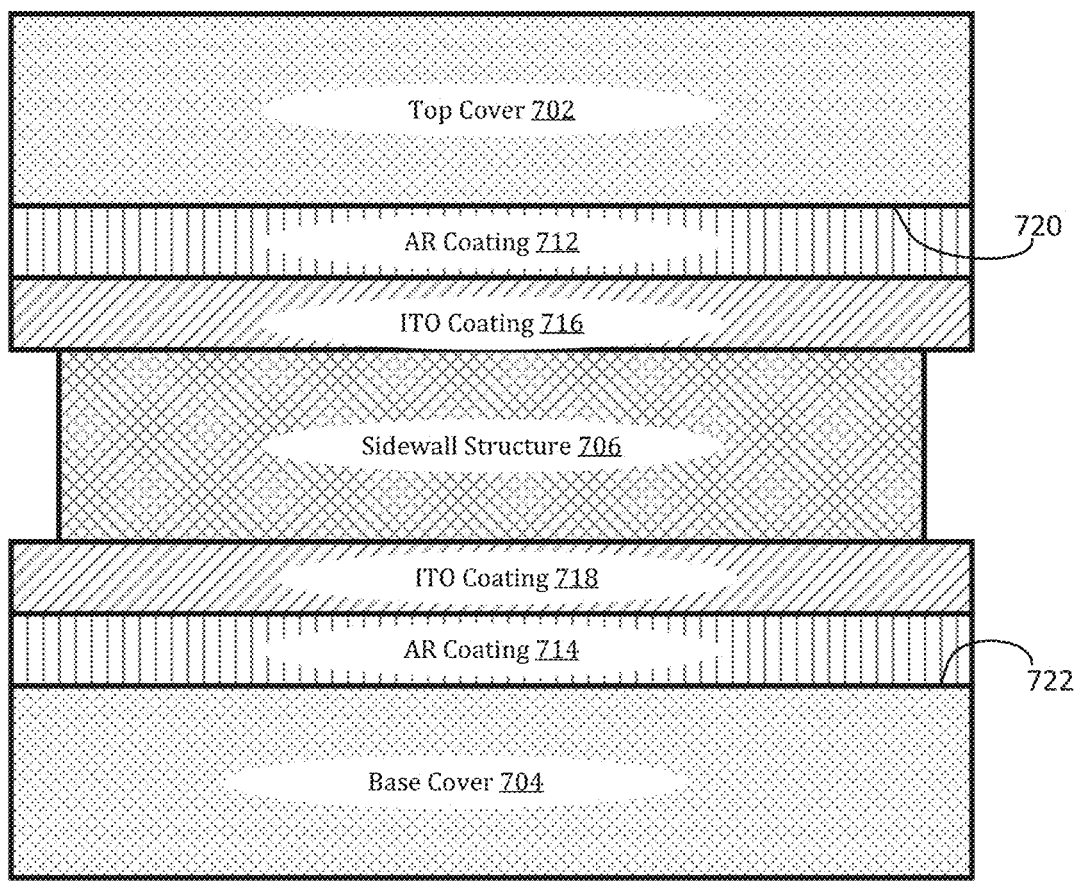
FIG. 7 includes side and top views of a quantum-particle cell structure.
Figure 7:
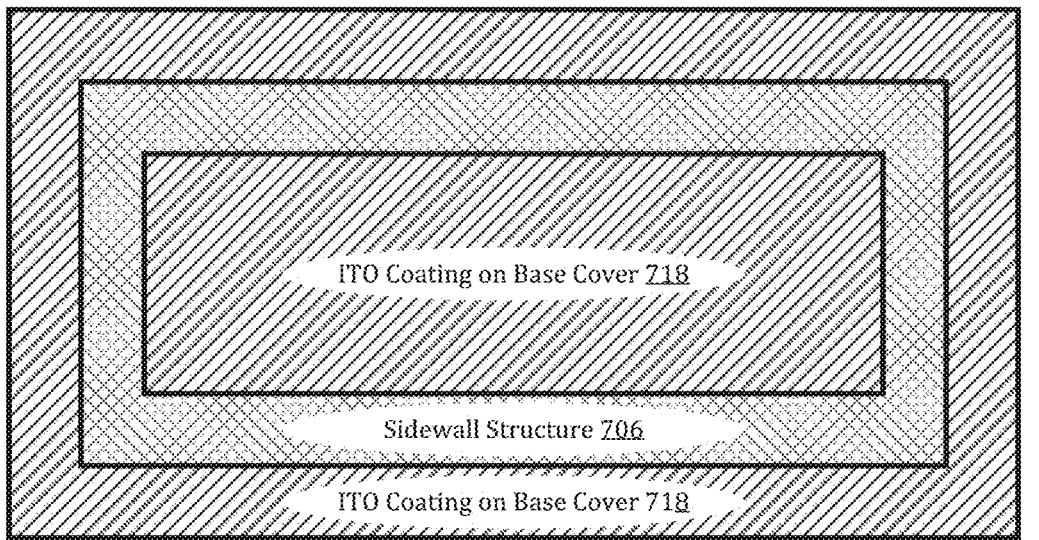

As shown in FIG. 7, a quantum-particle cell 700 includes a top cover 702 and a bottom cover 704 sandwiching a sidewall structure 706. Note that top cover 702 and bottom cover 704 extend beyond the perimeter of sidewall structure 706. This leaves room for external contacts for electrical feed throughs. Top cover 702 and bottom cover 704 have anti-reflective coatings 712 and 714 as well as indium-tin-oxide (ITO) coatings 716 and 718 over the vacuum-facing surfaces 720 and 722.

Figure 8:
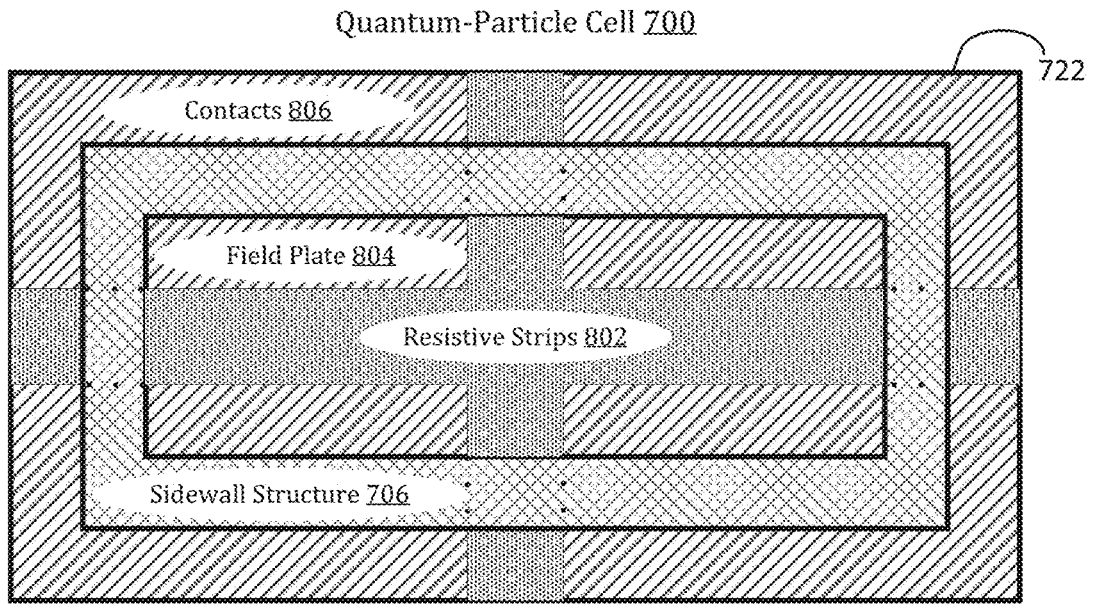
FIG. 8 includes exploded and top views of the particle cell structure of FIG. 7 with an indium-tin-oxide coatings on the top and bottom covers.

ITO is a transparent conductive coating into which a pulsed laser can write resistive areas, e.g., of 100 ohm-cm. For example, pulsed laser system 204 can be used to write resistive strips 802 into ITO coating 718 on base 704, as shown in FIG. 8. As a result, ITO coating 718 is divided into four conductive quadrants. Each quadrant includes a field plate in the interior of cell 700 and a contact 806 electrically connected to the field plate allowing a potential on the field plate to be controlled by an external potential source. (In the terminology in use herein, contacts 806 are over a vacuum-facing surface even though the portion of the surface they are on faces an ambient rather than the vacuum.) A corresponding patterning of ITO coating 716 of top cover 702 results in four more field plates and contacts. In total, the eight field plates and corresponding contacts allow for three-dimensional electric field control within quantum-particle cell 700, as taught in U.S. patent application Ser. No. 17/340,039 by Mark Saffman, Thomas William Noel, and Steven Michael Hughes filed 2021 Jun. 6.

The electric-field gradients achievable using the resistive strips is limited by their resistivity. Steeper gradients could be attained by removing ITO material rather than simply converting it. However, doing so would change the coating thickness, compromising the hermetic seal where the ITO material extends under or over the sidewall structure. A patterned deposit of insulator material could be used to restore the thickness lost by removing ITO. However, this deposition would have to occur before cell assembly is complete and may have to be impractically thin.

A major advantage of the pulsed laser conversion of ITO is that it can be performed after cell assembly is complete.

This enables a split manufacturing model in which ITO coated blanks are prepared and stored in inventory. The blanks could then have custom patterns of conductive and resistive material written in by pulsed laser upon (customer) demand. Patterning may be performed one focal spot at a time rastering a pattern, diffractively, holographically, inter-ferometrically or by other means using ultrafast pulses. Conductivity change may be a result of annealing, diffusion, oxidation, gas reaction, or ablation.

Embodiments use pico- and/or femto-second lasers for manufacturing and repairing vacuum chambers or cells, thus enabling cold atom and quantum vacuum systems. Embodi-ments provide for pulsed-laser in-vacuum bonding of similar and/or dissimilar materials, including materials with dis-similar coefficients of thermal expansion (CTEs). Thus, pulsed laser bonding opens the door to a wider range of materials so that, for example, materials with lower helium permeation can be used. (Helium permeation is an increas-ing concern as surface-area to volume ratios increase as quantum particle cells become more compact especially where active pumps are undesirable.) Use of the pulsed lasers allows bonding of materials with dissimilar CTEs to be done at low temperatures to avoid failure due to thermal cycling. All such in-vacuum bonding can be performed after vacuum processing to prevent CTE induced fractures of materials where exposure to water or heat or other bonding processes or their by-products would destroy components, while local heating of glass or sealing materials allows sensitive internal components to be saved. In-vacuum pulsed-laser bonding can be used with low-temperature anodic bonding or in lieu of anodic bonding (e.g., of silicon to glass) where exposure to oxygen produced from anodic bonding could cause harmful reaction to the cell or its contents.

Pulsed laser bonding can be used to complete or reinforce other types of bonds (anodic, contact, etc.) that could be incomplete or failed partial bonds. Pulsed laser bonding can be used to help propagate and complete partial bond perim-eters by pulling bonds over failed regions or even partially machining/evaporating/ablating/eroding/obliterating trapped obstructions prior to or during bond repair.

Pulsed lasers can also be used for fracture repair. Atom chips can develop fractures, and other non-hermetic anoma-lies especially near material transitions, e.g., glass-silicon. Pulsed laser bonding can be used to re-wet, merge, bond, and seal such faults. Bonded cells, e.g., glass cells, can, after time in use or sitting idle in storage, develop fractures from residual stresses such as from bonding. Such fractures can be sealed with local bonding as if the fracture were an incom-plete bond and the laser bonding is used to propagate a seal over the nearly conformal fracture with or without glass filler. Effectively, this can be a repair service or a recycling effort. Laser bonding can also be used on bonded cells that partially did not bond and/or that fractured. The fracture site can be repaired and the bond finished or else the fracture site can be heated during bonding to allow for deformation and finalization of a bond, e.g., an anodic bond. For non-optically transparent materials like silicon, ultrafast lasers at wavelengths to which that material is sufficiently transpar-ent, e.g., micron ($\mu$m) wavelengths for silicon, can be used for bond or fracture repair.

Pulsed lasers can be used to separate or stake components, e.g., of microelectromechanical systems (MEMS), e.g., to liberate MEMS-like structures that are meant to move freely. Such structures can be freed from securing connections, sprues, support scaffolds, etc., via ablation or induced frac-turing/cleaving. The restraining structure may have been by design and the laser ablation is analogous to a final release or liftoff procedure. The contact point can alternatively have been accidental in which parts cleaned for UHV naturally stick and laser release is used to overcome stiction. Pulsed lasers can be used to pre-treat surfaces that may be prone to stiction by partially ablating/eroding or changing the surface features or activation to reduce odds of stiction. Alterna-tively, pulsed lasers can be used to increase friction by making complimentary friction features in opposing faces. Adjusting powers and spot sizes can also induce bonding or fusion by locally melting materials, using their surface oxides or platings to stake them in place.

Pulsed lasers can be used to initiate auto singulation in arrayed laminate structures such as vapor cells. They can also be used to initiate fractures in materials that may be prone to fractures such as intentionally stressed silicon-glass bond pairs to force auto singulation especially on arrays of vapor cells that were manufactured from single large mate-rial substrates or assemblies but are ultimately intended to be individual discrete components.

Pulsed lasers can be used to stitch cut or cleave a hole in a cell for repair or rescue using stresses in cell to "pop out" the hole cut in the glass/silicon/etc., allowing a port to be cut without impure cutting fluids or debris destroying the cell. During the cutting operation, geometry is chosen to encour-age the liberated plug to self-separate and a minimum of ablated material is generated contaminating the inside of the vacuum chamber. After post cleaning and internal repair operations the surface is left sufficiently flat for a conformal cap to be bonded over the port (conical/tapered port). Bonding may be contact, anodic, or even laser bonded.

Singulation cuts/cleaves can be chosen to take advantage of residual stresses especially from anodic bonded parts on the glass such that the stress helps the singulation/liberation process of the cut plug such as by cutting a conical section just along the perimeter of a circular mating silicon joint. A pre-stressor material may be bonded to the plug to encour-age its liberation. Such material can be as simple as a contact, anodic, or laser bonded disc or other shape of silicon or other material with a known significantly different CTE from the native material. After bonding of the stressor plate, and then singulation cutting of the vacuum wall material CTE stresses may be exaggerated by application of direct heating or cooling be it thermal contact, radiation absorp-tion, acoustic energy, resistive, air jet, coolant exposure, etc.

Pulsed lasers can be used for pre-tacking bonds. For example, anodic bond parts can be pre-tacked where inter-nals cannot take temperature without UHV. The bonds can then be reformed with anodic bonding while under vacuum processing. Delicate bond parts can be pre-tacked using pulsed lasers on the inside seam to form a weak hermetic seal. The weak seal can then be reinforced with capillary application of silicate solution, hydroxide solution, solgel, or miscible/flowable bonding agents that may be more robust or provide other advantages over laser bonding.

When anodic or contact bonding, if the bond is incom-plete due to scratches, dust, or imperfections, laser bonding can be used to pull the completed bond region over incom-plete regions to seal the cell. When small scratches or imperfections cause potential virtual leaks (extreme low conductivity pathways to narrow trapped or near trapped reservoirs), laser bonding can be used to block the pathway and seal the pocket/scratch. Alternatively, the pulsed laser can be used to draw closed a bond over pocket/scratch to eliminate possibility of a virtual leak. Pulsed lasers can be used to create a controlled helium or other leak by creating a laser induced bond over a controlled, very narrow bond width so as to use the permeation through the small seam as a controlled diffusion "membrane".

The pulsed laser can be used for targeted annealing. For example, the annealing can involve locally stitching high stress parts as viewed by polariscope or other means of stress detection to normalize, or uniformize or relieve the stress to prevent future failure. The stress reduction can be performed by selective application of focused pulsed lasers or can be achieved by partial defocusing or decohering pulses to increase local thermal effects in a controlled manner. Repeated pulses over the same region at lower effective powers can be helpful to locally anneal. Alternatively, pulses near high stress regions, especially repeated pulses can be used to create a controlled terminating fracture, such as a dome, bubble, or guided fracture, to relieve stress without compromising the hermetic seal.

Pulsed lasers can be used to locally "stitch anneal" the surface of machined parts at internal corners where fractures are anticipated. It can be advantageous to induce stresses about high stress regions rather than within to help normalize the stress gradients present. Pulses, e.g., lower powered or diffused/defocused pulses in, near or opposite high stress regions can balance out stress and reduce fracture probability. Pulses, e.g., lower powered or diffused/defocused pulses can be used on material while heating the material either locally with a continuous wave (CW) or nanosecond-to-millisecond laser/energy source, or globally on a hot plate or oven to improve bonding and stress properties. Local heating with a laser can cause local swelling to improve contact or may just provide annealing during the bond.

Where optics or components are held by a material, laser pulses can be used to locally heat, deform, stress/de-stress, ablate, etc. to get micro motion adjustment for precision alignment or tuning such as for resonators or precision beam steering optic mounts. For resonant structures pulsed lasers can adjust refractive index or micro mechanical alignment by deforming, stressing, annealing or ablating stressed surfaces for fine cavity tuning. Pulsed lasers can also be used to write waveguide structures as part of walls of vacuum chambers or fine tune waveguide structures already assembled into vacuum chambers. Pulsed lasers can be used to locally deform, in vacuum, optics such as mirrors just below the reflective surface in order to locally and precisely deform the wavefront similar to adaptive optics. Pulsed lasers can be used to locally adjust wavefront errors of windows or lenses by microscale refractive index changes or by inducing diffractive structures.

Pulsed lasers can be used to machine holes in otherwise uniform coatings. Pulsed lasers can be used to control optical scatter within a vacuum cell by creating gradient index structures on regions or walls that have undesired incident light, either from partial reflections, diffraction, or scatter, to help either absorb with gradient index structures or to selectively control scatter angle with tightly controlled geometric surface structures. They can be used to intentionally degrade anti-reflection (AR), (highly reflective) HR, conductive coatings prior to installation or after installation into a vacuum chamber by ablating or optically changing the properties of the coating locally, thereby effectively making a spatial array of altered AR or HR effectiveness. This may be done to increase scattering of light, adjust reflection or transmission powers in a finely tuned optical system, or adjust the abruptness of optical transitions such as at the edge of coatings or at flaws in coatings to minimize diffractive effects.

Pulsed lasers can be used to intentionally structure effective AR surfaces via gradient index transition structures especially at sites of damaged AR coatings to minimize the effect of the damage. Structures can be tuned geometrically to control scatter in certain directions of interest due to geometric conditions of the optical regions of the vacuum cell. Pulsed lasers can be used to adjust permeation properties of a passivation or barrier coating to increase permeation through the barrier such as for controlled helium leaks or alkali or alkaline earth dispensing or other metal permeation out of an encapsulated/barriered/passivated reservoir. Such barriered reservoirs may have initially been intended to allow for high temperature vacuum processing or improve handleability during assembly and manufacture, but the barrier later would otherwise impede operation of the vacuum chamber.

Pulsed lasers can blast through protective oxides on strontium or other alkalines and alkalis that may have been encapsulated intentionally or accidentally with oxide or nitride or even sputtered, evaporated etc. metal or other barrier coatings to survive assembly in air or atmosphere but to be blasted/cracked open after sealing and during vacuum processing. Pulsed lasers can be used to intentionally ablate and create particulates that are otherwise electrostatically or mechanically captured such that the dramatically increased surface area of said material increases effective pumping speeds or capacities where such attributes are surface area dependent.

Pulsed lasers can be used for writing gratings into channel cells or other vacuum cells. A pulsed laser can be used to write custom gratings onto the inner walls of vacuum chambers before, during, or after assembly. The gratings can be into silicon, metal or other structures transparent or opaque. A pulsed laser can be used to help bond glass that may have custom gratings that cannot be bonded by normal wet or high temperature means due to coating or material type. For example, pulsed lasers can permit bonding over etched topography. Hermetic gaps may be filled with a filler and fused using the pulse laser.

Pulsed lasers can write electrical structures into thin films deposited on glass or layered into glass laminate structures in two or three-dimensions that are used within or as part of the vacuum chamber walls. Electrically conductive films can be exposed to vacuum or ambient or can be covered with an insulator or other coating such as nitride or oxide. Structures can be modified after assembly and vacuum processing to adjust or fix problems. For example, traces of prepatterned conductors such as platings on atom chips or vacuum walls or laminated under oxide coatings that may develop a short due to alkali permeation into the insulator gap, dendrite growth, gold migration, dust deposition, or other types of unintentional electrically conductive shorts can be burned/ablated/or otherwise micro-machined away with laser pulses at the surface or at targeted depths. Pulses can be lengthened and defocused to increase heating to help targeted thermal effects for short mitigation such as to help locally reflow a small gold bump or encourage selective ion migration especially in the presence of a strong electric potential.

Pulsed lasers can target and "destroy" or move through ablative precise momentum impulses of dust particles that are in sensitive locations such as on ion traps or atom chips. They can be used to form black silicon surface formation through targeting oxides for etching or direct ablation of black structures in glass, silicon, metals or other materials. Pulse lasers can work through thin silicon at near infrared wavelengths, e.g., 1064 nanometers (nm) and long infrared wavelengths (e.g., 1550 nm).

Pulsed lasers can be used in conjunction with hydroxide or silicon/silica/silicate solution to repair seams wherein the laser is used to make that material a little more homogenous. Microleaks can be filled with silicate, silica nanoparticles, solgel or other glass or glass precursors like silicon nanoparticles, like gravel in a pothole, and then be locally "melted" so as to fill any voids that the laser may not be able to seal by other means.

Figure 9:
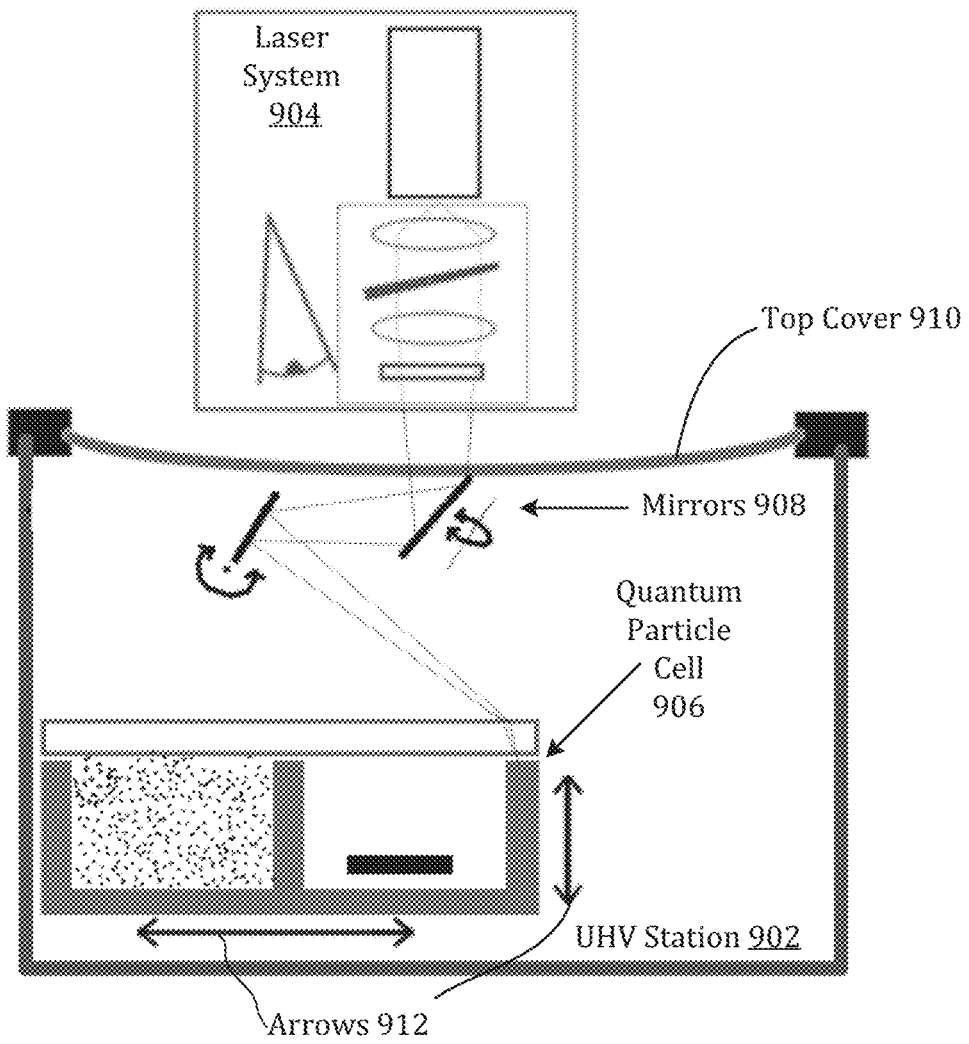
FIG. 9 is a schematic view of a quantum-particle cell manufacturing system with an ultra-high vacuum station having in-vacuum laser beam steering.
Figure 10:
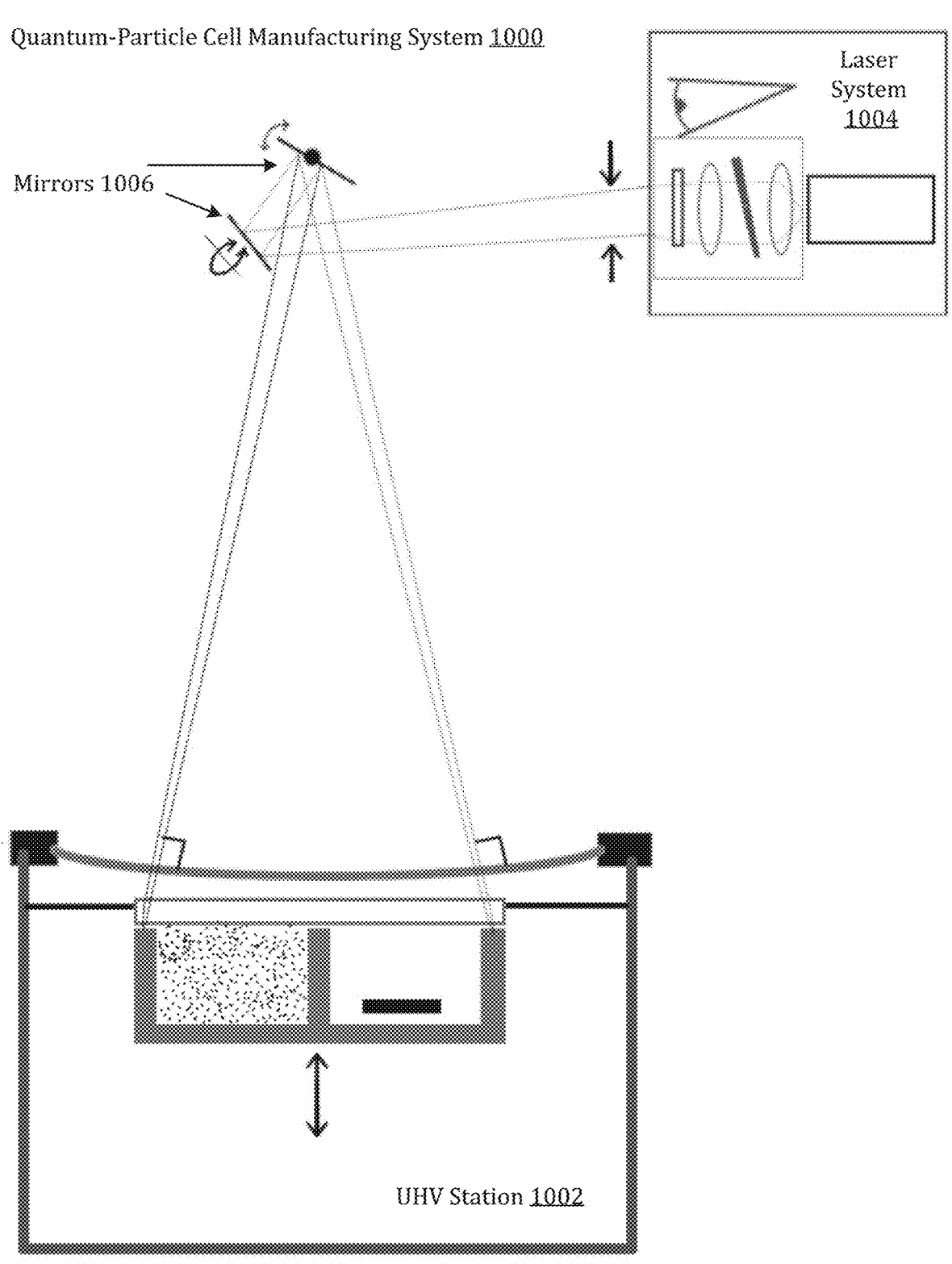
FIG. 10 is a schematic view of a quantum-particle cell manufacturing system with an ultra-high vacuum station and external laser beam steering.

As shown in FIG. 9, a quantum-particle cell manufacturing system 900 includes a UHV station 902 and a laser system 904 for manufacturing a quantum-particle cell 906. Laser system 904 includes a pair of controllable mirrors 908 located within UHV station 902 and used for steering beam produced by laser system 904. UHV station 902 includes a top cover 910, which is shown bowed in due to the pressure differential due to the ambient above and the UHV below. UHV station 902 also includes means for moving quantum-particle cell 906 in three dimensions within UHV station 902, as indicated by arrows 912. In an alternative embodiment, shown in FIG. 10, a quantum-particle manufacturing system 1000 includes a UHV station 1002 and a laser system 1004 with mirrors external to UHV station 1002.

Figure 11:
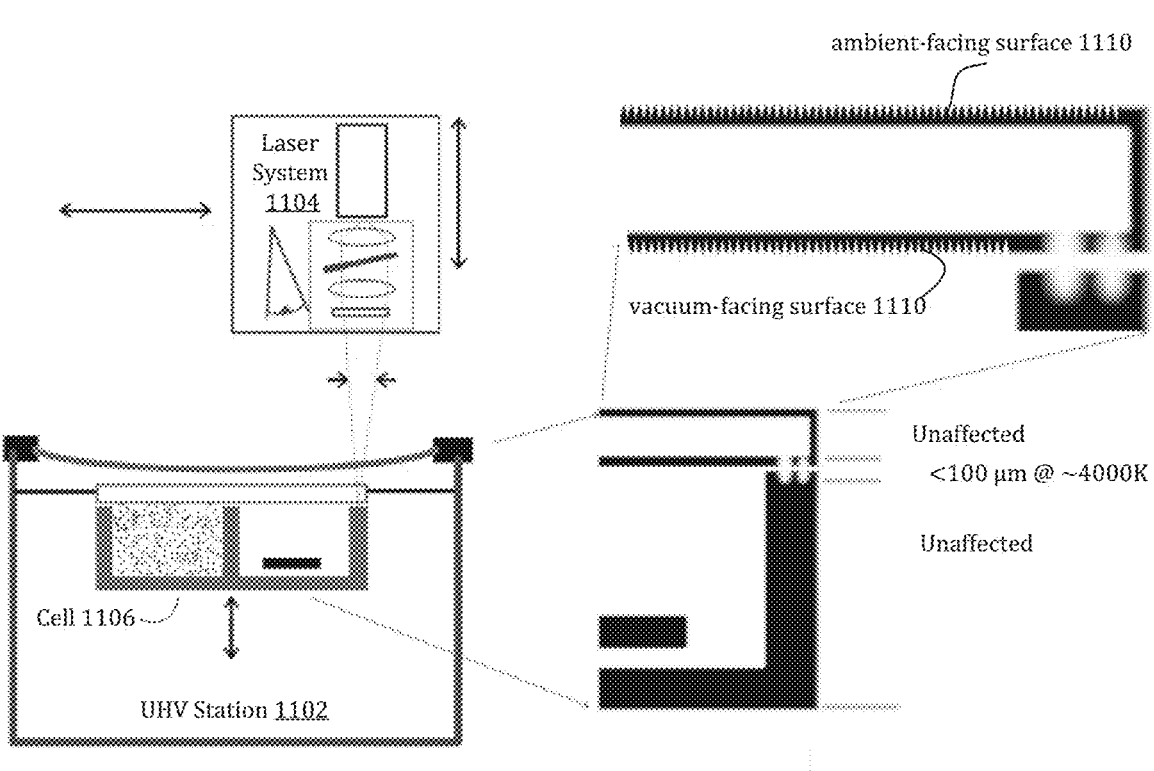
FIG. 11 is a schematic view of a quantum-particle cell manufacturing system with a moveable laser system.
Figures 12A, 12B:
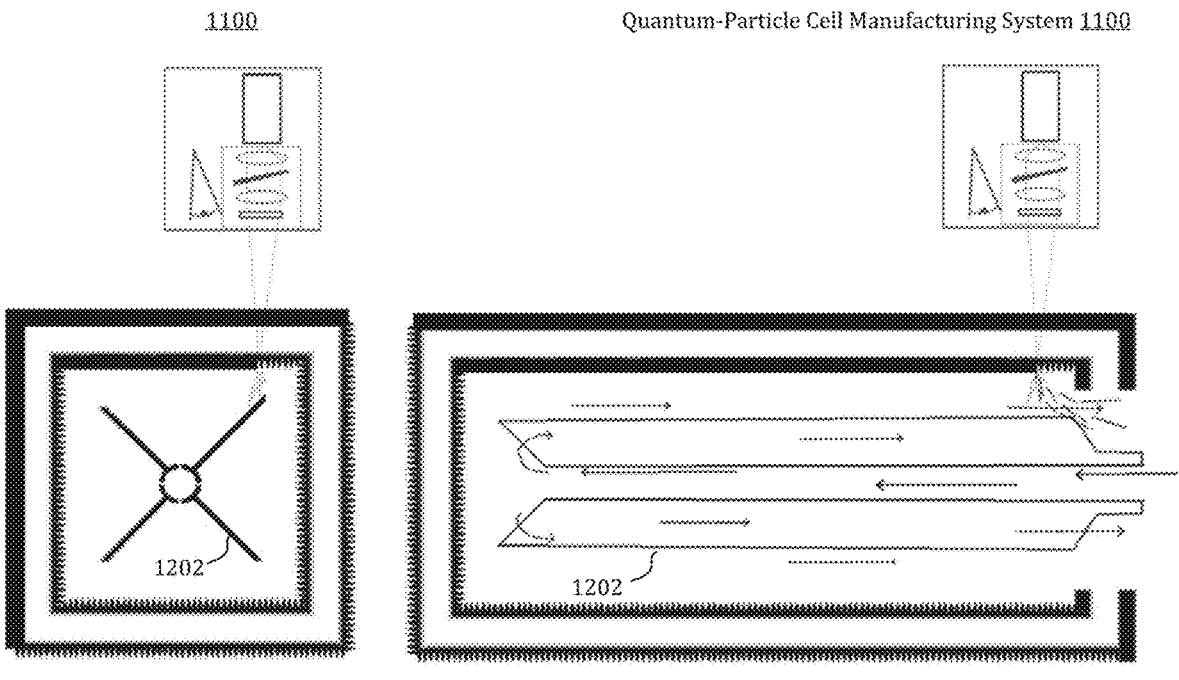
FIGS. 12A and 12B are two views of pulsed laser ablation of a square cell.

As shown in FIG. 11, a quantum-particle cell manufacturing system 1100 includes a UHV station 1102 and a laser system 1104 for manufacturing cells such as cell 1106. As shown in the details, pulsed laser system 1104 is used to etch patterns in external-facing and vacuum-facing surfaces 1110 and 1112. Heat from the laser beam can convert material in a 100 μm deep region, while leaving near-by unaffected. As indicated in FIG. 12, system 110 can be used with an insert 1202 that can be used to guide flowing vapor used to remove ablation remnants.

Figure 13:
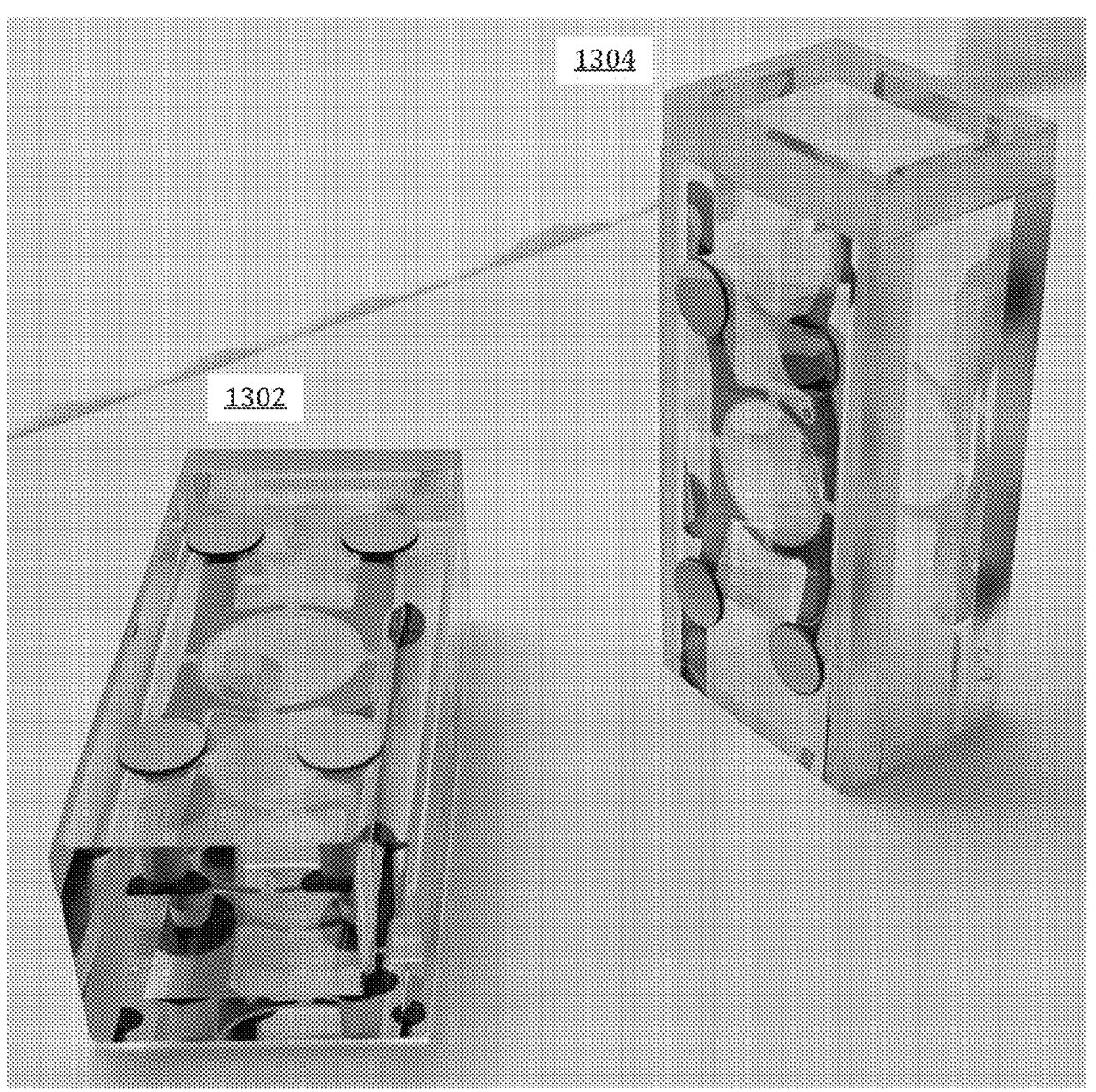
FIG. 13 is a gray-scale photograph of two quantum-particle cells manufactured in accordance with the present invention.
Figure 14:
FIG. 14 is a gray-scale photograph of a quantum-particle cell having a port for admitting source material and/or use in removing material during maintenance cycles.

FIG. 13 shows a pair of completed quantum-particle cells 1302 and 1304. FIG. 14 shows a quantum-particle cell 1402 with a stainless-steel port 1404 attached that can be used for maintenance cycles to re-establish a vacuum, e.g., after a bake-out procedure.

Herein, a "quantum particle" is a molecular entity that contains at least the nucleus of an alkali-metal atom or of an alkaline-earth-metal atom. A "molecular entity" is any constitutionally or isotopically distinct atom, molecule, ion, ion pair, radical, radical ion, complex, conformer, etc., identifiable as a separately distinguishable entity". Herein, "atom" encompasses neutral atoms and single-atom ions. A quantum-particle species includes all quantum particles with the same positive number of protons and the same positive number of neutrons. For example, molecular entities including rubidium 87, other isotopes of rubidium, other alkali metals, strontium and other alkaline-earth metals, and yttrium and other rare-earth metals are quantum particle species.

A "quantum-particle cell" is a vacuum cell (e.g., vacuum cell structure defining an interior with a pressure below $10^{-9}$ Torr) that contains quantum particles (i.e., plural quantum particles) and is intended to be used so that the quantum particles can assume a first quantum state, a second quantum state, and superpositions of those quantum states. A quantum-particle cell includes one or more vacuum boundary walls that separate an interior vacuum from an ambient. A vacuum boundary wall typically includes a vacuum-facing surface, portions of which may or may not actually face the vacuum (e.g., because they are bonded to other walls).

The lasers of interest herein can generate laser pulses of durations below one femto-second (or femtosecond), 10 femto-seconds, one pico-second (or picosecond), 10 pico-seconds, and one nanosecond. Electromagnetic radiation (EMR) wavelengths are provided for including ultra-violet, visible, and infrared wavelengths.

Herein, art labeled "prior art", if any, is admitted prior art; art not labelled "prior art" is not admitted prior art. The foregoing embodiments, variations thereupon, and modification thereto are provided for by the present invention, the scope of which is defined by the following claims.

What is claimed is:

1. A quantum-particle cell manufacturing process comprising:
   assembling a vacuum cell structure including a first vacuum boundary wall, the vacuum cell structure defining an interior with a pressure below $10^{-9}$ Torr, the vacuum cell structure containing plural quantum particles having a same positive number of protons and a same positive number of neutrons; and
   while the vacuum cell structure contains the plural quantum particles, directing laser pulses of durations below one nanosecond from outside the vacuum cell structure through the first vacuum boundary wall so as to modify a vacuum-facing surface of the vacuum cell;
   wherein the assembling includes contact or anodic bonding the first vacuum boundary wall to a second vacuum boundary wall without using laser pulses; and
   wherein:
   the laser pulses chemically modify a portion of the vacuum-facing surface of the vacuum cell structure,
   the laser pulses modify an electrical conductivity of a portion of the vacuum-facing surface of the vacuum cell structure, and/or
   the laser pulses remove material from the vacuum-facing surface of the vacuum cell structure.

2. The quantum-particle cell manufacturing process of claim 1 wherein the quantum particles include alkali-metal, alkaline-earth-metal or rare-earth metal atoms.

3. The quantum-particle cell manufacturing process of claim 1 wherein the laser pulses form a bond or reinforce a bond between the first vacuum boundary wall and the second vacuum boundary wall.

4. The quantum-particle cell manufacturing process of claim 1 wherein the laser pulses chemically modify a portion of the vacuum-facing surface of the vacuum cell structure.

5. The quantum-particle cell manufacturing process of claim 1 wherein the laser pulses modify an electrical conductivity of a portion of the vacuum-facing surface of the vacuum cell structure.

6. The quantum-particle cell manufacturing process of claim 1 wherein the laser pulses remove material from the vacuum-facing surface of the vacuum cell structure.

7. The quantum-particle cell manufacturing process of claim 1 wherein the laser pulses have durations less than 10 picoseconds.

8. The quantum-particle cell manufacturing process of claim 1 wherein the laser pulses have durations less than 10 femtoseconds.

9. The quantum-particle cell manufacturing process of claim 1 wherein a volume of a vacuum in the quantum-particle cell is below one milliliter.

10. The quantum-particle cell manufacturing process of claim 1 wherein the first vacuum boundary wall comprises silicon, and the second vacuum boundary wall comprises glass.

11. The quantum-particle cell manufacturing process of claim 1 wherein the laser pulses are applied along a closed path.

12. The quantum-particle cell manufacturing process of claim 4 wherein the laser pulses chemically modify a portion of the vacuum-facing surface of the vacuum cell structure up to a depth of 200 μm in either the first vacuum boundary wall or the second vacuum boundary wall.

13. The quantum-particle cell manufacturing process of claim 4 wherein the laser pulses increase a friction between the first vacuum boundary wall and the second vacuum boundary wall.

14. The quantum-particle cell manufacturing process of claim 4 wherein the laser pulses initiate fractures in materials of each of the first vacuum boundary wall and the second vacuum boundary wall.

15. The quantum-particle cell manufacturing process of claim 1 wherein a microelectromechanical system is staked to or separated from the portion of the vacuum-facing surface by the laser pulses.

16. The quantum-particle cell manufacturing process of claim 5 wherein the portion of the vacuum-facing surface comprises a coating of indium-tin-oxide.

17. The quantum-particle cell manufacturing process of claim 6 further comprising flowing a vapor over a portion of a surface of the vacuum cell structure.

18. The quantum-particle cell manufacturing process of claim 1 wherein a spot size of the laser pulses is based at least in part on a feature size of the vacuum-facing surface.

19. The quantum-particle cell manufacturing process of claim 5 wherein the portion of the vacuum-facing surface comprises a coating having a different refractive index than that of a material of the vacuum-facing surface.

20. A quantum-particle cell made by a manufacturing process comprising:

assembling a vacuum cell structure including a first vacuum boundary wall, the vacuum cell structure defining an interior with a pressure below $10^{-9}$ Torr, the vacuum cell structure containing plural quantum particles having a same positive number of protons and a same positive number of neutrons; and while the vacuum cell structure contains the plural quantum particles, directing laser pulses of durations below one nanosecond from outside the vacuum cell structure through the first vacuum boundary wall so as to modify a vacuum-facing surface of the vacuum cell;

wherein the assembling includes contact or anodic bonding the first vacuum boundary wall to a second vacuum boundary wall without using laser pulses; and wherein:

the laser pulses chemically modify a portion of the vacuum-facing surface of the vacuum cell structure, the laser pulses modify an electrical conductivity of a portion of the vacuum-facing surface of the vacuum cell structure, and/or the laser pulses remove material from the vacuum-facing surface of the vacuum cell structure.

\* \* \* \* \*